(12) United States Patent
Chai

(10) Patent No.: US 6,346,834 B1
(45) Date of Patent: Feb. 12, 2002

(54) POWER ON RESET CIRCUIT

(75) Inventor: Yong-yoong Chai, Seongnam (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 08/967,798

(22) Filed: Nov. 12, 1997

(30) Foreign Application Priority Data

Nov. 13, 1996 (KR) ............................................. 96-53820

(51) Int. Cl.[7] .................................................. H03L 7/00
(52) U.S. Cl. ...................... 327/143; 327/198; 327/52; 327/66
(58) Field of Search ................................ 327/143, 198, 327/52, 65, 89, 50, 51, 53, 66, 563; 330/253

(56) References Cited

U.S. PATENT DOCUMENTS

| | | | | |
|---|---|---|---|---|
| 4,142,118 A | * | 2/1979 | Guritz ........................ | 327/143 |
| 4,591,801 A | * | 5/1986 | Yamaguchi et al. ........ | 330/253 |
| 4,634,905 A | * | 1/1987 | Campbell, Jr. .............. | 327/143 |
| 5,103,115 A | * | 4/1992 | Ueda et al. ................. | 327/143 |
| 5,144,159 A | * | 9/1992 | Frisch et al. ................ | 327/143 |
| 5,677,643 A | * | 10/1997 | Tomita ........................ | 327/143 |
| 5,864,254 A | * | 1/1999 | Tashiro ........................ | 327/65 |
| 5,929,674 A | * | 7/1999 | Maccarrone et al. ........ | 327/143 |

* cited by examiner

*Primary Examiner*—Terry D. Cunningham
*Assistant Examiner*—Long Nguyen
(74) *Attorney, Agent, or Firm*—Marger Johnson & McCollom, P.C.

(57) ABSTRACT

A power on reset (POR) circuit in a semiconductor device which is process independent and resistant to noise present in a power supply voltage when the power supply voltage has not yet obtained a predetermined operational voltage level. The POR circuit includes a differential amplifier, a non-inverting input control circuit and an inverting input control circuit. The differential amplifier senses and amplifies a difference in voltage between the non-inverting input terminal and the inverting input terminal. The non-inverting input control circuit controls a voltage of the non-inverting input terminal of the differential amplifier. The inverting input control circuit controls a voltage of the inverting input terminal of the differential amplifier.

8 Claims, 3 Drawing Sheets

POWER ON RESET CIRCUIT

BACKGROUND OF THE INVENTION

1. Field of the Invention

The present invention relates to a semiconductor device, and more particularly, to a power on reset (POR) circuit for a semiconductor device.

2. Description of the Related Art

In general, a POR circuit is necessary for a semiconductor device. Typically, the POR circuit consists of an external resister and a capacitor. However, the current trend is for the POR circuit to be fabricated on the same semiconductor die as the rest of the circuit.

The function of the POR circuit is to prevent a malfunction from occurring when a power supply voltage is applied to a semiconductor device. When the semiconductor device is operated before the power supply voltage reaches a suitable operational level, the semiconductor device can malfunction. Accordingly, a reset signal (RESET) is needed which is 'ON' when the power supply voltage is applied but has not risen to a predetermined voltage level and is 'OFF' after this power supply has reached a stable operating voltage FIG. 1 shows a conventional POR circuit. A Schmitt Trigger 103 is used for the POR circuit. That is, once the power supply voltage VDD reaches or surpasses a first predetermined voltage threshold after the initial application of the power supply voltage, then the output 'Vout' becomes active, i.e. logic "low", and when the power supply voltage VDD falls below a second predetermined voltage threshold, then the output 'Vout' becomes inactive, i.e. logic "high". The threshold voltage of pull-up transistor 101 determines the value of the first predetermined threshold voltage in the circuit of FIG. 1, which, in turn, causes the output 'Vout' to turn-on during the application of the power supply voltage. The threshold voltage of pull-down transistor 102 determines the value of the second predetermined voltage threshold in the circuit of FIG. 1, which causes the output 'Vout' to turn-off when the power supply voltage is removed. Accordingly, the threshold voltages of the pull-up transistor 101 and the pull-down transistor 102 can be controlled in order to determine the voltage at which operation of the semiconductor device is initiated and the voltage at which operation of the semiconductor device is suspended.

However, the presence of a noise signal in the supply voltage VDD can cause the POR circuit of FIG. 1 to behave abnormally. This is because the input terminal N104 of the Schmitt Trigger 103 does not have a discharge path. As a result, the output terminal 'Vout' may transit to an "ON" state in response to an unstable state of the power supply voltage. Also, the power supply voltage 'VDD' can be unstable during operation of the semiconductor device and the POR circuit of FIG. 1 is unable to detect this unstable state and reset the semiconductor device. Also, the circuit is highly sensitive to changes in the semiconductor fabrication process and a small change in the process can cause a large change in the first and second voltage thresholds.

SUMMARY OF THE INVENTION

It is an object of the present invention to provide a power on reset (POR) circuit which is process independent and which is capable of preventing malfunction in a semiconductor circuit when noise is present in a power supply voltage before the power supply voltage has reached an operational level.

Accordingly, to achieve the above object, there is provided a POR circuit including a differential amplifier for sensing and amplifying a difference in voltages between a non-inverting input terminal and an inverting input terminal, to generate an output signal. The POR circuit further includes a non-inverting input control circuit controlling a voltage of the non-inverting input terminal of the differential amplifier. Also, the POR circuit includes an inverting input control circuit controlling a voltage of the inverting input terminal of the differential amplifier.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

Figure 1:
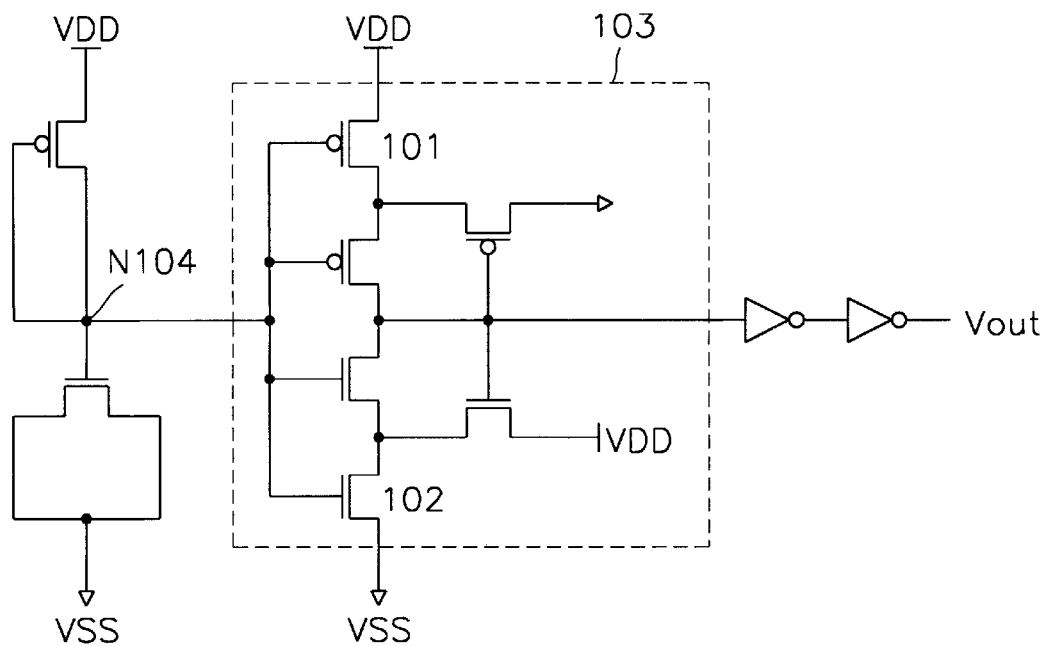
FIG. 1 is a circuit diagram of a conventional power on reset (POR) circuit.
Figure 2:
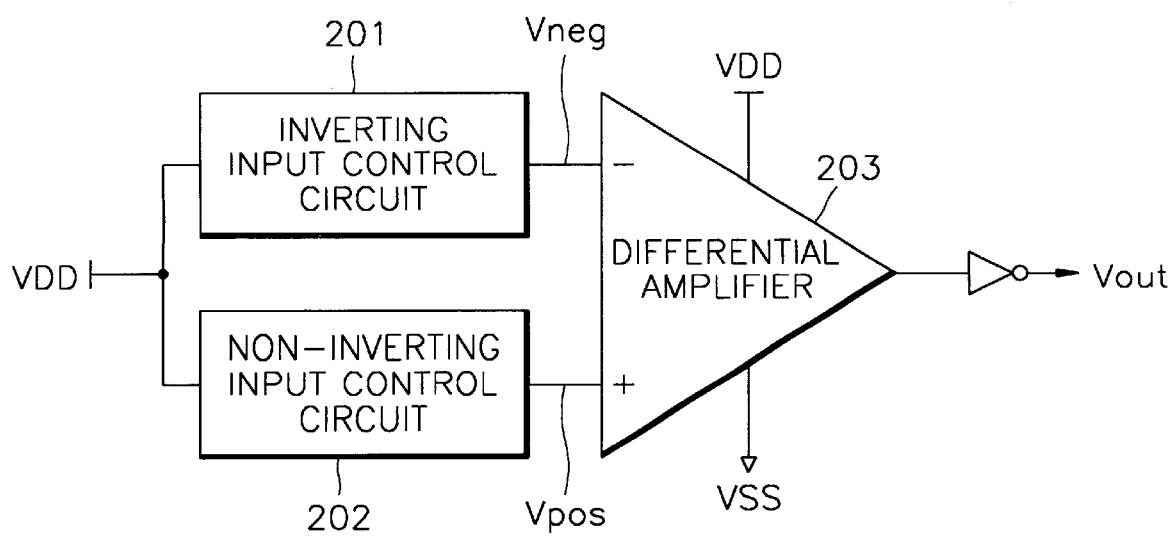
FIG. 2 is a block diagram of a POR circuit according to the present invention.

FIG. 2 is a block diagram of an embodiment of a POR circuit according to the present invention. The output of an inverting input control circuit 201 is connected to an inverting input terminal of a differential amplifier 203, and a non-inverting input control circuit 202 is connected to a non-inverting input terminal of the differential amplifier 203.

Figure 3:
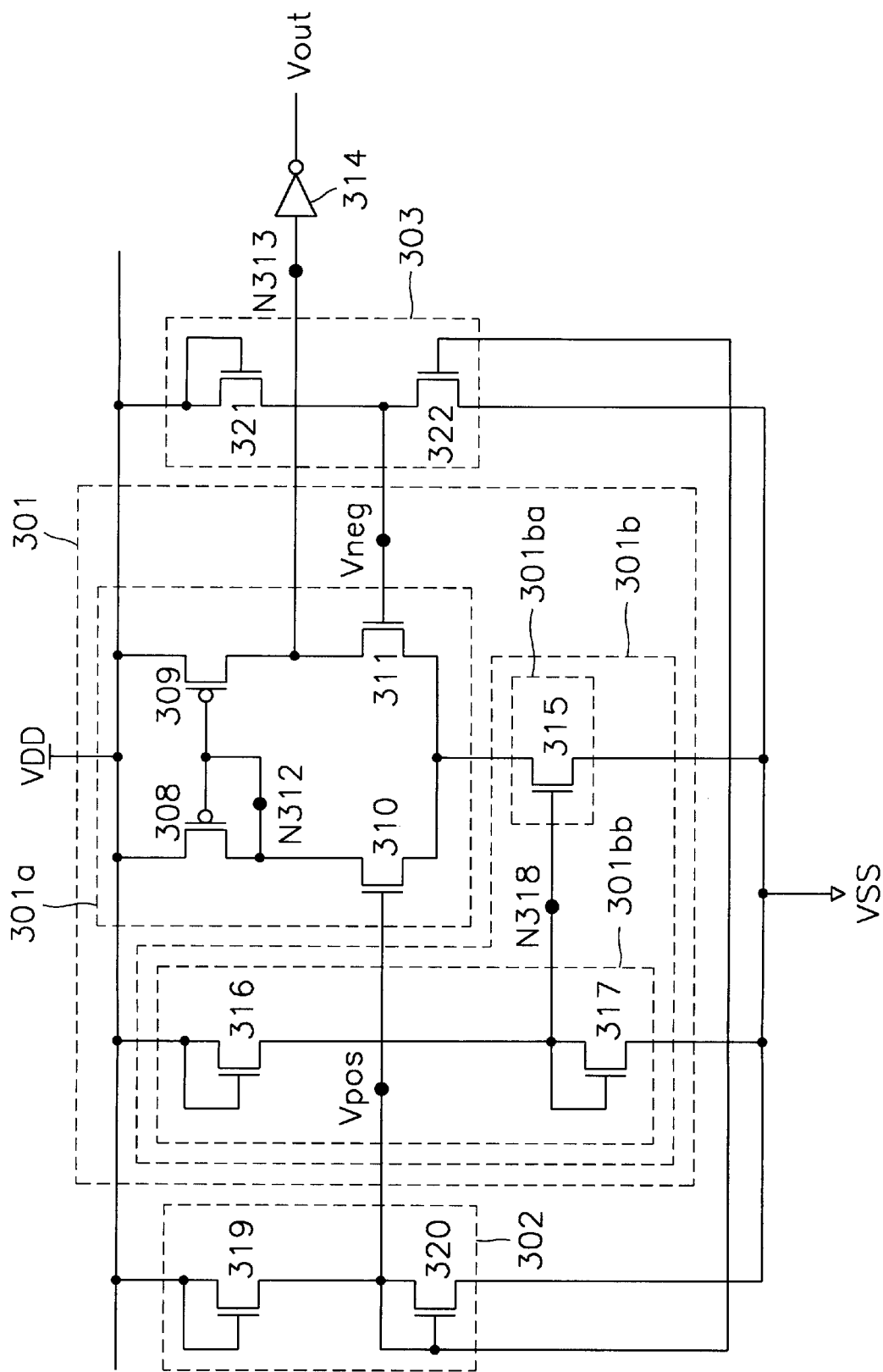
FIG. 3 shows an embodiment of the POR circuit of FIG. 2.

Referring to FIG. 3, a differential amplifier 301 includes a sensing amplifying portion 301a for sensing and amplifying a difference in voltage between a non-inverting input terminal 'Vpos' and an inverting input terminal 'Vneg', and a current control portion 301b for controlling the current of the sensing amplifying portion 301a.

The sensing amplifying portion 301a includes first and second pull-up transistors 308 and 309 having sources connected to a power supply terminal 'VDD' and first and second pull-down transistors 310 and 311 having sources commonly connected to the current control unit 301b. The drain of each of the first and second pull-up transistors 308 and 309 is connected to the drain of each of the first and second pull-down transistors 310 and 311, respectively. The gates of the first and second pull-up transistors 308 and 309 are connected to each other and commonly to the drain of the first pull-down transistor 310. An output terminal of the non-inverting input control circuit 302 is connected to the gate of the first pull-down transistor 310, and an output terminal of the inverting input control circuit 303 is connected to the gate of the second pull-down transistor 311. The first and second pull-up transistors 308 and 309 are PMOS transistors while the first and second pull-down transistors 310 and 311 are NMOS transistors. Accordingly, when a voltage at input terminal 'Vpos' is lower than the voltage at input terminal 'Vneg', then the voltage at the output node N313 of the sensing amplifying portion 301a drops to a level which is close to the voltage at ground supply terminal 'VSS'. Conversely, when the voltage at input terminal 'Vpos' is higher than the voltage at input terminal 'Vneg', then the voltage at the output N313 of the sensing amplifying portion 301a rises to a voltage level that is close to the voltage at power supply terminal 'VDD'.

The current control portion 301b includes a current source unit 301ba for controlling the current passing through the sensing amplifying portion 301a and a current control unit 301bb for controlling the current flow of the current source unit 301ba. The current source unit 301ba is comprised of an NMOS transistor 315 having a drain connected in common to the sources of the first and second pull-down transistors 310 and 311 of the sensing amplifying portion 301a, a source connected to the ground supply terminal 'VSS', and a gate connected to the output of the current control unit 301bb, which is the drain of diode connected NMOS transistor 317. The NMOS transistor 315 maintains a constant current in the sensing amplifying portion 301a. The current control unit 301bb is comprised of an NMOS transistor 316 having its drain and gate connected commonly to the power supply voltage 'VDD' and NMOS transistor 317 having its source connected to the ground supply voltage 'VSS' and its drain and gate connected commonly to the source of NMOS transistor 316. A common circuit mode N318 of NMOS transistors 316 and 317 is the output of the current control unit 301bb and is connected to the gate of the NMOS transistor 315 of the current source unit 301ba. Accordingly, the current control unit 301bb controls the current flow of the current source unit 301ba.

The non-inverting input control circuit 302 is comprised of an enhancement mode NMOS transistor (NMOS transistor) 319 with its drain and gate commonly connected to the power supply terminal 'VDD', and an NMOS transistor 320 having its drain and gate commonly connected to each other and its source connected to the ground supply terminal 'VSS'. A common connection node of NMOS transistors 319 and 320 is connected to the non-inverting input terminal 'Vpos' of differential amplifier 301.

The inverting input control circuit 303 is comprised of a depletion mode NMOS transistor 321 having its drain and gate commonly connected to the power supply terminal 'VDD' and an NMOS transistor 322 having its source connected to the ground supply terminal 'VSS' and its gate connected to the input terminal 'Vpos' which is also the output of the non-inverting input control circuit 302. A common connection terminal between the depletion NMOS transistor 321 and the NMOS transistor 322 is connected to the inverting input terminal 'Vneg' of the differential amplifier 301.

When the power supply voltage applied to terminal 'VDD' is applied to the circuit of FIG. 3, i.e. the voltage at terminal VDD is increased, then the operation of the circuit is as follows. During initial application of the power supply voltage to 'VDD', the circuit node 'Vneg' connected to the output of the inverting input control circuit 303 has a voltage level that is higher than the voltage level at the node 'Vpos' connected to the output of the non-inverting input control circuit 302. This is because a threshold voltage of the depletion NMOS transistor 321 of the inverting input control circuit 303 is lower than that of the NMOS transistor 319 of the non-inverting input control circuit 302 so that the depletion NMOS transistor 321 is the first to be turned on. Accordingly, the output node N313 of the differential amplifier 301 is turned-off, i.e. the voltage level is close to the ground supply voltage at terminal 'VSS'. The output signal 'Vout', which is obtained by inverting the voltage at the output node N313 by inverter 314, is in an 'ON' state and increases along with the power supply voltage applied to terminal 'VDD'. However, when the power supply voltage at 'VDD' rises above a predetermined level, the voltage generated at the 'Vneg' node by the inverting input control circuit 303 is lower than the voltage generated at the 'Vpos' node by the non-inverting input control circuit 302. This behavior can be obtained from using a smaller ratio of width to length in the depletion NMOS transistor 321 than in the enhancement NMOS transistor 319. Accordingly, the output node N313 of the differential amplifier 301 is turned-on, i.e. has a voltage level that is close to the power supply voltage at 'VDD', and 'Vout', which is obtained by inverting the voltage at node N313 in inverter 314, is in an 'OFF' or logic 'low' state.

Figure 4:
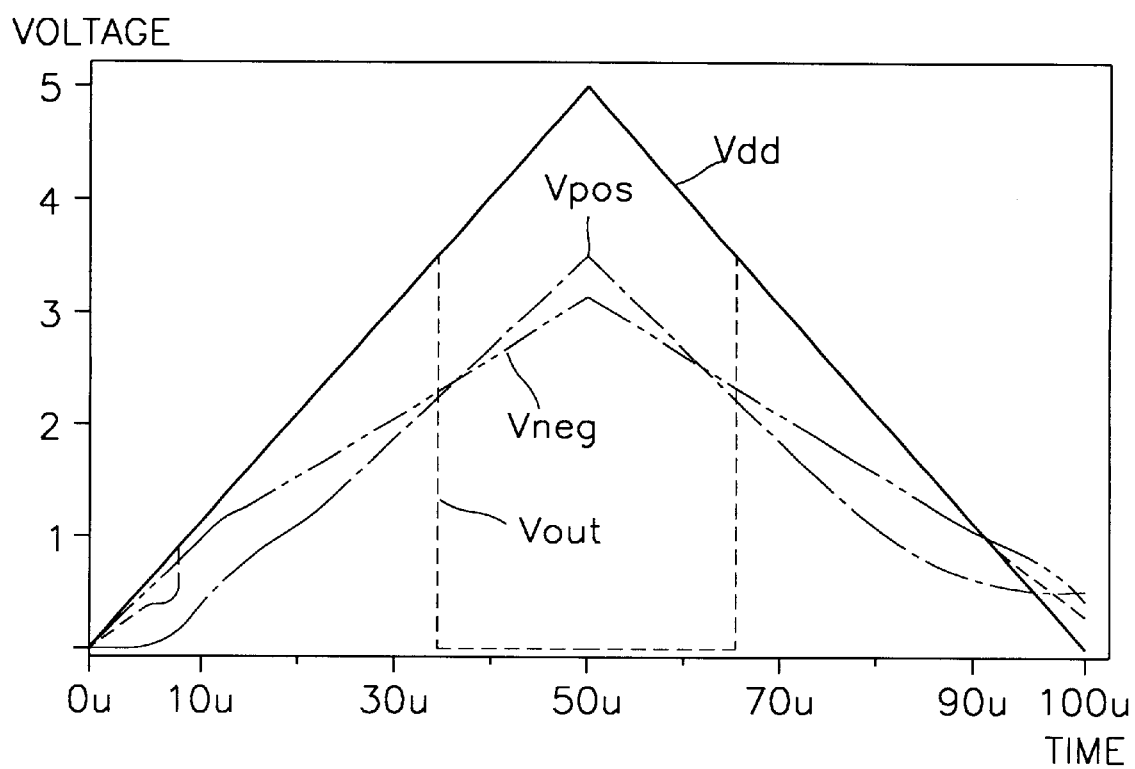
FIG. 4 is a graph showing the simulated result values for the circuit of FIG. 3 response to a change in a power supply voltage.

Referring to FIG. 4, the voltage generated at the 'Vpos' node by the non-inverting input control circuit 302 can be changed linearly by varying the relative sizes of the two transistors 319 and 320. However, the voltage generated at the 'Vneg' node by the inverting input control circuit 303, which is connected in common mode to the depletion NMOS transistor 321 and the NMOS transistor 322, cannot be changed linearly by varying the relative sizes of transistors 321 and 322. This is because the voltage at 'Vneg' cannot be regarded as a resistance ratio of the two transistors 321 and 322. Rather, the NMOS transistor 322 of the inverting input control circuit 303 acts as a current source and the depletion NMOS transistor 321 acts as a current load.

At initial operation, in the time from 0us. to 35us in FIG. 4, the 'Vneg' node is at a voltage level that is higher than the voltage level at the 'Vpos' node. Accordingly, the voltage at 'Vout' in FIG. 3 is in an 'ON' state, i.e. logic 'high'. However, when the power supply voltage 'VDD' exceeds a predetermined voltage at 35us in FIG. 4, then the voltage at 'Vneg' is lower than that at 'Vpos' which causes the voltage at 'Vout' to transition to an 'OFF' state', i.e. logic 'low'. Accordingly, the POR circuit of FIG. 3 performs the appropriate power on reset operation.

It should be understood that the invention is not limited to the illustrated embodiment and that a person of skill in the art will recognize that many changes and modifications can be made to the embodiment above and still remain within the scope of the invention.

The POR circuit according to the present invention is independent of changes in process conditions and is resistant to noise present in the power supply voltage encountered before the power supply voltage reaches its predetermined operational voltage level.

What is claimed is:

1. A power-on reset (POR) circuit of a semiconductor device, comprising:

a power supply terminal configured to receive a power supply voltage;

a ground terminal configured to receive a ground voltage;

a differential amplifier for sensing a difference in voltage between a first input terminal and a second input terminal to generate an output signal;

a non-inverting input control circuit for controlling a voltage of the first input terminal of the differential amplifier; and an inverting input control circuit for controlling a voltage of the second input terminal of the differential amplifier;

wherein the non-inverting input control circuit comprises a enhancement mode NMOS transistor coupled between the power supply terminal and the first input terminal of the differential amplifier;

wherein the inverting input control circuit comprises a depletion mode transistor coupled between the power supply terminal and the second input terminal of the differential amplifier;

wherein the non-inverting input control circuit further comprises a first MOS transistor having a drain and a gate each coupled to the first input terminal of the differential amplifier and a source coupled to the ground terminal; and wherein the inverting input control circuit further comprises a second MOS transistor having a drain coupled to the second input terminal, a source coupled to the ground terminal and a gate coupled to the first input terminal.

2. The POR circuit of claim 1, wherein the differential amplifier comprises:

a sensing amplifying portion for sensing and amplifying a difference in voltage between the first input terminal of the differential amplifier and the second input terminal of the differential amplifier; and a current control portion for controlling current of the sensing amplifying portion.

3. The POR circuit of claim 2, wherein the sensing amplifying portion comprises:

a first pull-up transistor having a source coupled to the power supply terminal and a drain and a gate coupled to each other;

a second pull-up transistor having a source coupled to the power supply terminal, a gate coupled to the gate of the first pull-up transistor, and a drain coupled to an output terminal of the differential amplifier;

a first pull-down transistor having a source coupled to the current control portion, a drain coupled to the drain of the first pull-up transistor, and a gate coupled to an output terminal of the first input control circuit; and a second pull-down transistor having a source coupled to the current control portion, a gate coupled to an output terminal of the second input control circuit, and a drain coupled to the drain of the second pull-up transistor.

4. The POR circuit of claim 2, wherein the current control portion comprises:

a current source coupled between the sensing amplifying portion and the ground terminal; and a current control unit for controlling a current flow in the current source unit.

5. The POR circuit of claim 3, wherein the current control portion includes:

a current control unit for controlling a current flow in the current source unit; and a MOS transistor having a drain terminal coupled to the source of the first pull-down transistor and the source of the second pull-down transistor of the sensing amplifying portion, a source coupled to the ground terminal, and a gate coupled to an output of the current control unit.

6. The POR circuit of claim 4, wherein the current control unit comprises:

a first MOS transistor having a drain and a gate coupled to the power supply terminal; and a second MOS transistor having a source coupled to the ground terminal, and a drain and a gate coupled to the source of the first MOS transistor, and wherein the drain of the second MOS transistor is coupled to a control terminal of the current source.

7. A method for generating a reset signal, the method comprising the steps:

generating a first signal responsive to a power supply voltage exceeding a first threshold voltage level;

generating a second signal responsive to the power supply voltage exceeding a second threshold voltage level; and differentially comparing the first and second signals in order to produce the reset signal;

wherein the step of generating a first signal comprises:

coupling a gate and drain of a first NMOS transistor to the power supply voltage, wherein the first NMOS transistor is an enhancement mode device; and coupling the first NMOS transistor in series with a second NMOS transistor between the power supply voltage and a ground potential, wherein a gate and drain of the second NMOS transistor are coupled to a source of the first NMOS transistor, and a source of the second NMOS transistor is coupled to the ground potential;

wherein the step of generating a second signal comprises:

coupling a gate and a drain of a third NMOS transistor to a power supply voltage, wherein the third NMOS transistor is a depletion mode device; and coupling the third NMOS transistor in series with a fourth NMOS transistor between the power supply voltage and a ground potential, wherein a drain of the fourth NMOS transistor is coupled to a source of the third NMOS transistor, a source of the fourth NMOS transistor is coupled to the ground potential, and a gate of the fourth NMOS transistor is coupled to the gate of the second NMOS transistor; and wherein the step of differentially comparing the first and second signals comprises:

coupling the source of the first NMOS transistor to the non-inverting terminal of a differential amplifier; and coupling the source of the third NMOS transistor to the inverting terminal of the differential amplifier.

8. The method of claim 7, wherein the step of differentially comparing the first and second signals further includes the steps:

coupling the differential amplifier in series with a current source between the power supply voltage and the ground voltage;

coupling a gate and drain of a fifth NMOS transistor to the power supply voltage;

diode connecting a sixth NMOS transistor;

connecting the fifth and sixth NMOS transistors in series between the power supply voltage and the ground voltage; and controlling the current source using a voltage at the gate terminal of the sixth NMOS transistor.

* * * * *